(12) United States Patent
Kim

(10) Patent No.: US 8,957,717 B2
(45) Date of Patent: Feb. 17, 2015

(54) SCAN FLIP-FLOP, METHOD OF OPERATING THE SAME, AND DEVICE INCLUDING THE SCAN FLIP-FLOP

(71) Applicant: Samsung Electronics Co., Ltd., Suwon-si (KR)

(72) Inventor: Min Su Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/028,806

(22) Filed: Sep. 17, 2013

(65) Prior Publication Data

US 2014/0176212 A1  Jun. 26, 2014

(30) Foreign Application Priority Data

Dec. 26, 2012 (KR) .......... 10-2012-0153248

(51) Int. Cl.
*G01R 31/3185* (2006.01)
*H03K 3/037* (2006.01)

(52) U.S. Cl.
CPC ........ *G01R 31/318541* (2013.01); *H03K 3/037* (2013.01)
USPC ............ 327/202; 327/203; 327/311; 327/212

(58) Field of Classification Search
USPC ......... 327/161, 185, 199–203, 208–212, 214, 327/215, 218
See application file for complete search history.

(56) References Cited

U.S. PATENT DOCUMENTS

| | | | |
|---|---|---|---|
| 6,412,098 B1 * | 6/2002 | Jin ................ | 716/136 |
| 7,590,900 B2 | 9/2009 | Kim et al. | |
| 7,609,800 B1 | 10/2009 | Lim et al. | |
| 7,649,395 B2 | 1/2010 | Ahmadi | |
| 2004/0190331 A1 * | 9/2004 | Ross et al. ......... | 365/154 |
| 2008/0104466 A1 * | 5/2008 | Menon et al. ....... | 714/727 |
| 2008/0231336 A1 | 9/2008 | Wu et al. | |
| 2009/0172486 A1 * | 7/2009 | Ross et al. ......... | 714/729 |
| 2011/0190331 A1 * | 8/2011 | Avey et al. ......... | 514/282 |
| 2012/0246529 A1 * | 9/2012 | Tekumalla et al. ..... | 714/726 |

FOREIGN PATENT DOCUMENTS

| | | |
|---|---|---|
| JP | 2000227456 | 8/2000 |
| JP | 2001201542 | 7/2001 |
| JP | 2009009544 | 1/2009 |
| JP | 2009192461 | 8/2009 |

* cited by examiner

*Primary Examiner* — Brandon S Cole
(74) *Attorney, Agent, or Firm* — Onello & Mello, LLP

(57) ABSTRACT

A scan flip-flop may include a selector outputting a data signal or a scan input signal in response to a scan enable signal, and a flip-flop that latches an output signal of the selector or the data signal, based on a clock signal and a low voltage signal.

20 Claims, 7 Drawing Sheets

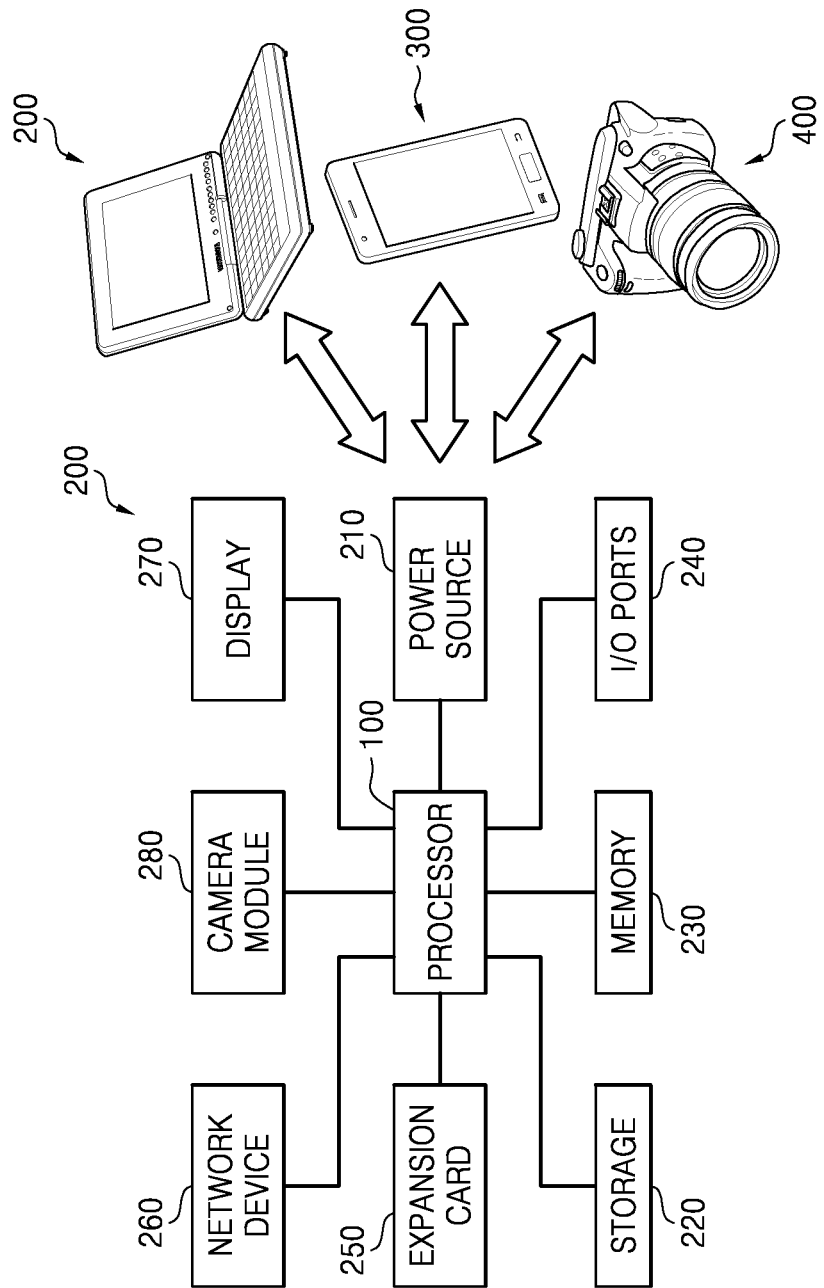

SCAN FLIP-FLOP, METHOD OF OPERATING THE SAME, AND DEVICE INCLUDING THE SCAN FLIP-FLOP

CROSS-REFERENCE TO RELATED APPLICATIONS

This application claims priority under 35 U.S.C. §119(a) from Korean Patent Application No. 10-2012-0153248 filed on Dec. 26, 2012, the disclosure of which is hereby incorporated by reference in its entirety.

BACKGROUND

Example embodiments in accordance with principles of inventive concepts relate to scan flip-flops, and more particularly, to a scan flip-flop capable of stably operating by reducing a hold time, a method of operating the scan flip-flop, and a data processing device including the scan flip-flop.

Conventional master-slave flip-flops are highly reliable and widely used. However, because the hold margins of a conventional master-slave flip-flop significantly increase at low operational voltages, such flip-flops include hold buffers in order to ensure proper operation at low operational voltage and operation of such flip-flops may thereby be restricted.

SUMMARY

According to an aspect of exemplary embodiments in accordance with principles of inventive concepts, a scan flip-flop comprising a selector outputting a data signal or a scan input signal under control of a scan enable signal, and a flip-flop latching an output signal of the selector or the data signal, under control of on a clock signal and a low voltage signal, and the low voltage signal is a control signal indicative of whether the scan flip-flop is operating with a low operating voltage.

According to an aspect of exemplary embodiments in accordance with principles of inventive concepts, when the low voltage signal is in a first level, the flip-flop may latch the data signal according to the clock signal.

According to an aspect of exemplary embodiments in accordance with principles of inventive concepts, when the scan enable signal is in a first level and the low voltage signal is in a second level, the selector may output the data signal, and the flip-flop latches the data signal output by the selector according to the clock signal.

According to an aspect of exemplary embodiments in accordance with principles of inventive concepts, when the scan enable signal is in a second level and the low voltage signal is in the second level, the selector may output the scan input signal, and the flip-flop may latch the scan input signal output by the selector according to the clock signal.

According to an aspect of exemplary embodiments in accordance with principles of inventive concepts, the scan flip-flop may further include at least one delay circuit delaying at least one of the data signal input to the selector, the scan input signal input to the selector, or the output signal of the selector.

According to an aspect of exemplary embodiments in accordance with principles of inventive concepts, the flip-flop may include a multiplexer outputting the output signal of the selector or the data signal in response to the low voltage signal, and a latch circuit latching an output signal of the multiplexer according to the clock signal. The flip-flop may be implemented by using an edge-triggered flip-flop, a master-slave flip-flop, a pulse-base flip-flop, a semi-dynamic flip-flop, a double edge trigger flip-flop, or a sense-amplifier flip-flop.

According to an aspect of exemplary embodiments in accordance with principles of inventive concepts, a data processing device includes the scan flip-flop and a logic circuit which controls the scan flip-flop.

According to an aspect of exemplary embodiments in accordance with principles of inventive concepts, the scan flip-flop may further include at least one delay circuit delaying at least one of the data signal input to the selector, the scan input signal input to the selector, or the output signal of the selector.

According to an aspect of exemplary embodiments in accordance with principles of inventive concepts, the flip-flop may include a multiplexer outputting the output signal of the selector or the data signal in response to the low voltage signal, and a latch circuit latching an output signal of the multiplexer according to the clock signal.

According to an aspect of exemplary embodiments in accordance with principles of inventive concepts, the data processing device may be a system on chip (SoC), a processor, a central processing unit (CPU), a personal computer (PC), a data server, a smart phone, or a tablet PC.

According to an aspect of exemplary embodiments in accordance with principles of inventive concepts, a method of operating a scan flip-flop includes outputting a data signal or a scan input signal as a first output signal in response to a scan enable signal, and latching the first output signal or the data signal, based on a clock signal and a low voltage signal, and the low voltage signal is a control signal indicative of whether the scan flip-flop is operating with a low operating voltage.

According to an aspect of exemplary embodiments in accordance with principles of inventive concepts, the latching may include outputting the first signal or the data signal as a second output signal in response to the low voltage signal, and latching the second output signal according to the clock signal.

According to an aspect of exemplary embodiments in accordance with principles of inventive concepts, a scan flip-flop includes: a flip-flop that includes a data input port and a scan input port, and a selector connected to the scan input port, wherein data signal or scan input signal is input to the scan input port via the selector according to a scan operating mode and a low voltage operating mode, and the data signal is directly input to the data input port according to a normal operating mode.

According to an aspect of exemplary embodiments in accordance with principles of inventive concepts, the scan flip-flop circuit may further include at least one delay circuit delaying at least one of the data signal input to the selector, the scan input signal input to the selector, or the output signal of the selector.

According to an aspect of exemplary embodiments in accordance with principles of inventive concepts, the flip-flop may be an edge-triggered flip-flop.

According to an aspect of exemplary embodiments in accordance with principles of inventive concepts, the flip-flop may be a master slave flip-flop.

According to an aspect of exemplary embodiments in accordance with principles of inventive concepts, the flip-flop may be semi-dynamic flip-flop.

According to an aspect of exemplary embodiments in accordance with principles of inventive concepts, a portable electronic device including the scan flip-flop having: a flip-flop that includes a data input port and a scan input port, and a selector connected to the scan input port, wherein data signal or scan input signal is input to the scan input port via the selector according to a scan operating mode and a low voltage operating mode, and the data signal is directly input to the data input port according to a normal operating mode. According to an aspect of exemplary embodiments in accordance with principles of inventive concepts a portable device that includes including the scan flip-flop having: a flip-flop that includes a data input port and a scan input port, and a selector connected to the scan input port, wherein data signal or scan input signal is input to the scan input port via the selector according to a scan operating mode and a low voltage operating mode, and the data signal is directly input to the data input port according to a normal operating mode. is a cellular telephone.

BRIEF DESCRIPTION OF THE DRAWINGS

FIG. 7 is a block diagram of a data processing device including the scan flip-flop illustrated in FIG. 1 or 3, according to an exemplary embodiment in accordance with principles of inventive concepts.

DETAILED DESCRIPTION OF THE EMBODIMENTS

Figure 1:
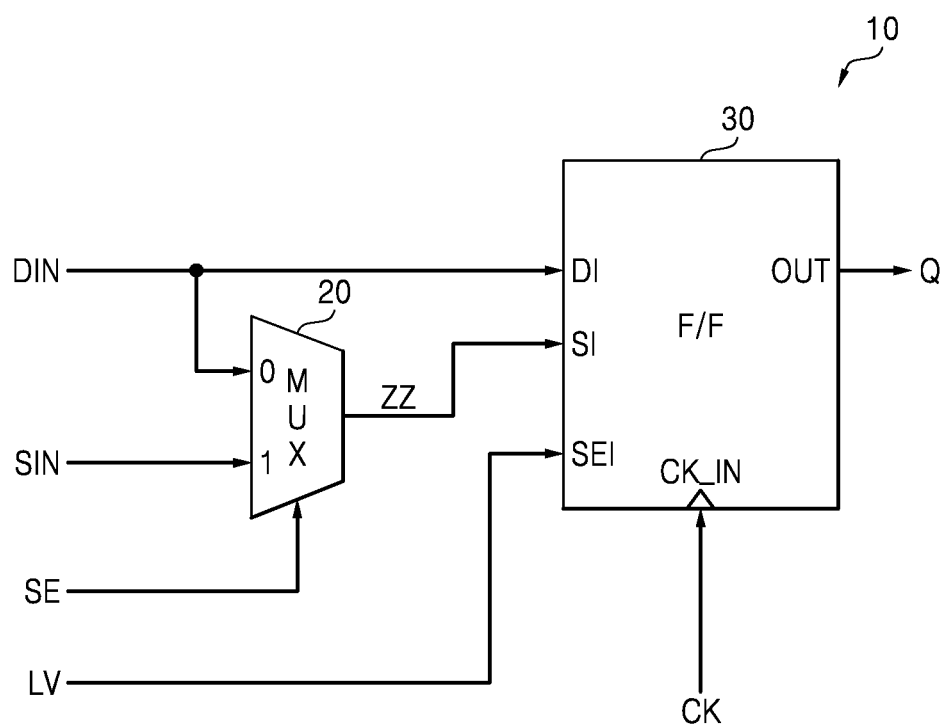
FIG. 1 is a schematic block diagram of a scan flip-flop according to an exemplary embodiment in accordance with principles of inventive concepts.

Exemplary embodiments in accordance with principles of inventive concepts will now be described more fully with reference to the accompanying drawings, in which exemplary embodiments are shown. Exemplary embodiments in accordance with principles of inventive concepts may, however, be embodied in many different forms and should not be construed as being limited to the embodiments set forth herein; rather, these embodiments are provided so that this disclosure will be thorough and complete, and will fully convey the concept of exemplary embodiments to those of ordinary skill in the art. In the drawings, the thicknesses of layers and regions may be exaggerated for clarity. Like reference numerals in the drawings denote like elements, and thus their description may not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on"). The word "or" is used in an inclusive sense, unless otherwise indicated.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "bottom," "below," "lower," or "beneath" other elements or features would then be oriented "atop," or "above," the other elements or features. Thus, the exemplary terms "bottom," or "below" can encompass both an orientation of above and below, top and bottom. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments in accordance with principles of inventive concepts are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments in accordance with principles of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments in accordance with principles of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic block diagram of an exemplary embodiment of a scan flip-flop 10 in accordance with principles of inventive concepts which may include a selector 20 and a flip-flop 30. The selector 20 may output a data signal DIN or a scan input signal SIN as an output signal ZZ to the flip-flop 30, under control of scan enable signal SE. Selector 20 may be implemented using a multiplexer (MUX), for example.

In exemplary embodiments in accordance with principles of inventive concepts, scan input signal SIN may be a signal for testing the scan flip-flop 10, and, in particular, the flip-flop 30. According to an exemplary embodiment, the data signal DIN may be a parallel data signal including one bit or a plurality of bits.

In exemplary embodiments in accordance with principles of inventive concepts, when the scan enable signal SE is in a first level, for example, a low level or logic 0, the selector 20 may select the data signal DIN received via a first input port 0 and output the data signal DIN as the output signal ZZ to the flip-flop 30 and when the scan enable signal SE is in a second level, for example, a high level or logic 1, the selector 20 may select the scan input signal SIN received via a second input port 1 and output the scan input signal SIN as the output signal ZZ to the flip-flop 30.

Because the output signal ZZ output by the selector 20, for example, the data signal DIN or the scan input signal SIN, is transmitted from the selector 20 to a scan input port SI of the flip-flop 30, the output signal ZZ may be delayed relative to data signal DIN directly input to a data input port DI of the flip-flop 30. The data signal DIN may be directly input to the data input port DI of the flip-flop 30 or may be input to the scan input port SI of the flip-flop 30 via the selector 20.

The flip-flop 30 may latch the output signal ZZ of the selector 20 received via the scan input port SI or the data signal DIN received via the data input port DI, based on a clock signal CK and a low voltage signal LV. In exemplary embodiments in accordance with principles of inventive concepts, low voltage signal LV is a control signal that indicates when the scan flip-flop 10 and/or associated circuitry is operating in a low voltage operating mode (or at a low operating voltage). The flip-flop 30 may output the latched data signal DIN or the latched output signal ZZ as an output signal Q via an output port OUT, according to the clock signal CK.

The flip-flop 30 may include: the data input port DI, which receives the data signal DIN, the scan input port SI, which receives the output signal ZZ of the selector 20, a scan enable port SEI, which receives the low voltage signal LV, a control port CK_IN, which receives the clock signal CK, and the output port OUT, which outputs the latched data signal DIN or the latched output signal ZZ as the output signal Q.

Although it is illustrated in FIG. 1 that the latched data signal DIN or the latched output signal ZZ is output as the output signal Q via the output port OUT of the flip-flop 30, the output signal Q and a complementary output signal complementary to the output signal Q may be output, for example.

According to an exemplary embodiment, the flip-flop 30 may also include an output port for outputting the complementary output signal.

In exemplary embodiments in accordance with principles of inventive concepts, low voltage signal LV may be input to the flip-flop 30 via the scan enable port SEI, and the scan enable signal SE may be input to the selector 20.

In exemplary embodiments in accordance with principles of inventive concepts, when the low voltage signal LV is in a first level, the flip-flop 30 may latch the data signal DIN received via the data input port DI of the flip-flop 30, according to the clock signal CK. That is, when the low voltage signal LV is in a first level, the flip-flop 30 may latch the data signal DIN directly input to the data input port DI of the flip-flop 30, regardless of the level of the scan enable signal SE.

In exemplary embodiments in accordance with principles of inventive concepts, when the scan enable signal SE is in the first level and the low voltage signal LV is in a second level, the flip-flop 30 may latch the data signal DIN output by the selector 20 according to the clock signal CK and when the scan enable signal SE is in the second level and the low voltage signal LV is in the second level, the flip-flop 30 may latch the scan input signal SIN output by the selector 20 according to the clock signal CK. In exemplary embodiments in accordance with principles of inventive concepts, when the low voltage signal LV is in the first level, the scan flip-flop 10 may perform a normal operating mode for latching the data signal DIN directly input to the data input port DI of the flip-flop 30 regardless of the level of the scan enable signal SE. The scan flip-flop 10 and/or associated circuitry is operating the normal operating mode at a normal operating voltage.

As described above, because either the data signal DIN or the scan input signal SIN is transmitted to the scan input port SI of the flip-flop 30 via the selector 20, the setup time of the scan flip-flop 10 may increase, and a hold time thereof may decrease. Accordingly, the scan flip-flop 10 may thereby eliminate hold-time violations, and may perform stable operation even at a low operating voltage. In exemplary embodiments in accordance with principles of inventive concepts, when the scan enable signal SE is in the first level and the low voltage signal LV is in the second level, the scan flip-flop 10 may perform a low voltage operating mode for latching the data signal DIN input to the scan input port SI of the flip-flop 30 via the selector 20 at the low operating voltage. The scan flip-flop 10 and/or associated circuitry is operating the low voltage operating mode at the low operating voltage. For example, the low operating voltage is less than the normal operating voltage. When the scan enable signal SE is in the second level and the low voltage signal LV is in the second level, the scan flip-flop 10 may perform a scan operating mode for latching the scan input signal SIN input to the scan input port SI of the flip-flop 30 via the selector 20.

In exemplary embodiments in accordance with principles of inventive concepts, the level of the scan enable signal SE and the level of the low voltage signal LV may be determined by a control signal generation circuit (not shown) according to an operating indication signal that indicates normal operating mode, low voltage operating mode, or scan operating mode, for example. Because scan flip-flop 10 performs a scan operation using a very short hold time, a more stable scan test may be implemented and because, in exemplary embodiments in accordance with principles of inventive concepts, the scan flip-flop 10 performs a relatively slow scan operation, an increase in a setup time, due, for example, to the delay associated with selector 20, has no negative effect.

Although, in exemplary embodiments in accordance with principles of inventive concepts, scan flip-flop 10 is able to perform a normal operating mode, a low voltage operating mode, and a scan operating mode, when the scan flip-flop 10 requires a stable operation rather than a fast operation at a high operating voltage (e.g., a normal operating voltage), the scan flip-flop 10 may stably operate even at the high operating voltage according to the low voltage signal LV. That is, the low voltage signal LV of the scan flip-flop 10 is not only determined according to the voltage state of the scan flip-flop 10 or a device including the scan flip-flop 10, which may be, for example, a data processing device.

Figure 2:
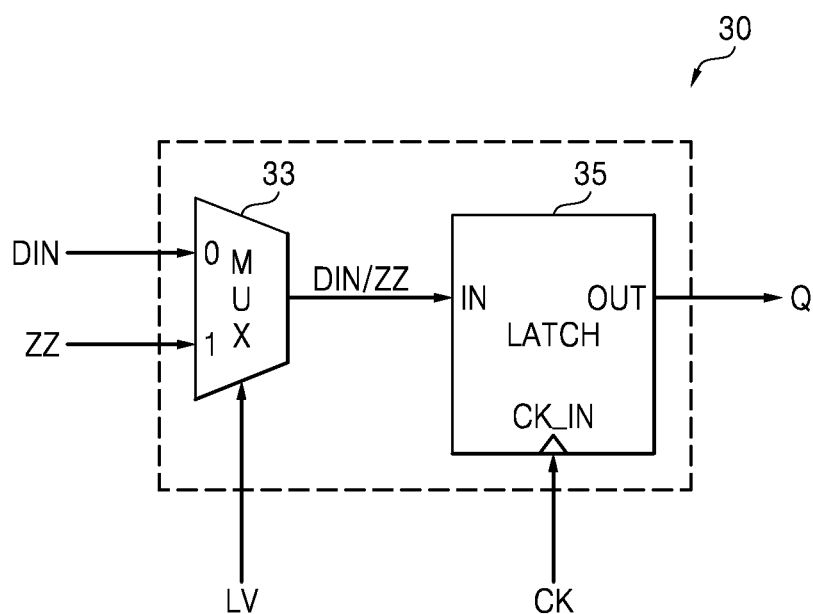
FIG. 2 is a block diagram of a flip-flop included in the scan flip-flop of FIG. 1.

FIG. 2 is a block diagram of an exemplary embodiment in accordance with principles of inventive concepts of flip-flop 30 included in the scan flip-flop 10 of FIG. 1. Referring to FIGS. 1 and 2, the flip-flop 30 may include a multiplexer 33 and a latch circuit 35 and may be implemented using an edge-triggered flip-flop, a master-slave flip-flop, a pulse-base flip-flop, a semi-dynamic flip-flop, a double edge trigger flip-flop, a sense-amplifier flip-flop, for example.

In exemplary embodiments in accordance with principles of inventive concepts, the flip-flop 30 may be implemented using a flip-flop that latches data at a rising edge or falling edge of the clock signal CK, keeps the data for one half cycle of the clock signal CK, for example, until a next falling or rising edge, and performs an operation, such as a precharge operation, for the other half cycle of the clock signal CK, for example.

In exemplary embodiments in accordance with principles of inventive concepts, multiplexer 33 may output the data signal DIN received via a first input port 0 or the output signal ZZ of the selector 20 received via a second input port 1, in response to the low voltage signal LV. For example, when the low voltage signal LV is in the first level, the multiplexer 33 may output the data signal DIN received via the first input port 0 to the latch circuit 35. That is, in such exemplary embodiments, when the low voltage signal LV is in the first level, the multiplexer 33 may output the data signal DIN directly input to the data input port DI of the flip-flop 30 to the latch circuit 40 35, regardless of the level of the scan enable signal SE.

In exemplary embodiments in accordance with principles of inventive concepts, when the low voltage signal LV is in the second level, the multiplexer 33 may output the output signal ZZ of the selector 20 received via the second input port 1 to the latch circuit 35. For example, when the scan enable signal SE is in the first level and the low voltage signal LV is in the second level, the multiplexer 33 may output the data signal DIN output by the selector 20 to the latch circuit 35 and when the scan enable signal SE is in the second level and the low voltage signal LV is in the second level, the multiplexer 33 may output the scan input signal SIN output by the selector 20 to the latch circuit 35.

In exemplary embodiments in accordance with principles of inventive concepts, latch circuit 35 may latch the output signal DIN or ZZ of the multiplexer 33 according to the clock signal CK. The latch circuit 35 may include an input port IN, which receives the output signal DIN or ZZ of the multiplexer 33, a control port CK_IN, which receives the clock signal CK, and an output port OUT, which outputs a latched signal DIN or ZZ as the output signal Q, for example.

Although it is illustrated in FIG. 2 that the latched signal DIN or ZZ is output as the output signal Q via the output port OUT of the latch circuit 35, in exemplary embodiments in accordance with principles of inventive concepts, the output signal Q and a complementary output signal complementary to the output signal Q may be output, for example. In such cases, the latch circuit 35 may further include an output port for outputting the complementary output signal.

When the low voltage signal LV is in the first level, the latch circuit 35 may latch the data signal DIN directly input to the data input port DI of the flip-flop 30, according to the clock signal CK.

In exemplary embodiments in accordance with principles of inventive concepts, when the scan enable signal SE is in the first level and the low voltage signal LV is in the second level, the latch circuit 35 may latch the data signal DIN output by the selector 20 according to the clock signal CK and when the scan enable signal SE is in the second level and the low voltage signal LV is in the second level, the latch circuit 35 may latch the scan input signal SIN output by the selector 20 according to the clock signal CK.

In exemplary embodiments in accordance with principles of inventive concepts, latch circuit 35 may output the latched signal DIN or ZZ as the output signal Q via the output port OUT, according to the clock signal CK, for example.

Figure 3:
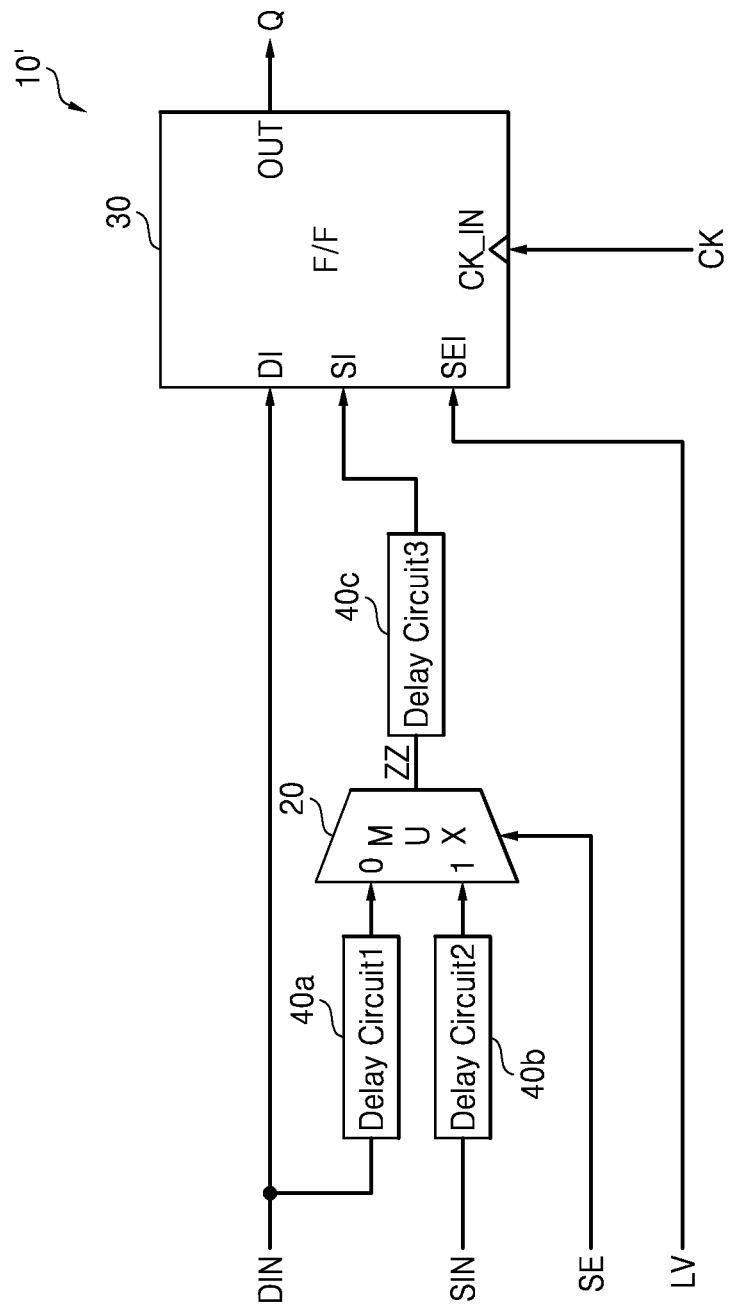
FIG. 3 is a schematic block diagram of a scan flip-flop according to an exemplary embodiment in accordance with principles of inventive concepts.

FIG. 3 is a schematic block diagram of an exemplary embodiment of a scan flip-flop 10' in accordance with principles of inventive concepts. Scan flip-flop 10' may include the selector 20, the flip-flop 30, and at least one delay circuit 40a, 40b, or 40c. In exemplary embodiments in accordance with principles of inventive concepts, the at least one delay circuit 40a, 40b, or 40c may delay at least one of the data signal DIN input to the selector 20, the scan input signal SIN input to the selector 20, and the output signal ZZ of the selector 20. For example, the at least one delay circuit 40a, 40b, or 40c may be implemented by using devices capable of delaying respective input signals, such as inverter chains or buffers.

Operations of the selector 20 and the flip-flop 30 of FIG. 3 are substantially the same as those described above in the discussion related to FIGS. 1 and 2. Because the at least one delay circuit 40a, 40b, or 40c delays the at least one of the data signal DIN input to the selector 20, the scan input signal SIN input to the selector 20, and the output signal ZZ of the selector 20, the hold time of the scan flip-flop 10' may further decrease. That is, the scan flip-flop 10' may more stably operate due to the decreased hold time. Accordingly, scan flip-flop 10' in accordance with principles of inventive concepts may more enhance operational characteristics such as, for example, the characteristics of a low voltage operating mode and/or a scan operating mode.

Figure 4:
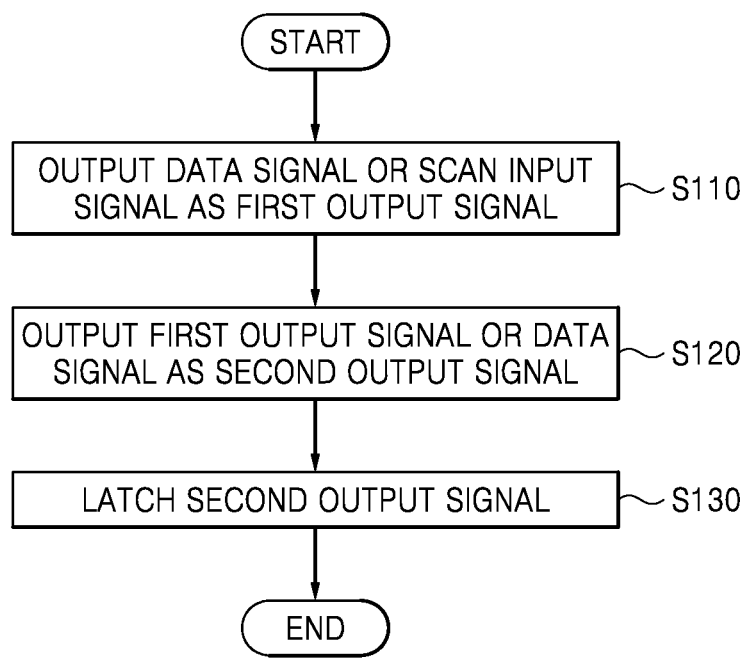
FIG. 4 is a flowchart of a method of operating the scan flip-flop illustrated in FIG. 1 or 3, according to an exemplary embodiment in accordance with principles of inventive concepts.

FIG. 4 is a flowchart of a method of operating a scan flip-flop such as exemplary scan flip-flop 10 of FIG. 1 or the scan flip-flop 10' of FIG. 3 in accordance with principles of inventive concepts. Referring to FIGS. 1 through 4, the selector 20 may output the data signal DIN or the scan input signal SIN as a first output signal in response to the scan enable signal SE, in operation S110.

The flip-flop 30 may latch the first output signal or the data signal DIN based on the clock signal CK and the low voltage signal LV. In particular, the multiplexer 33 may output the first output signal or the data signal DIN as a second output signal in response to the low voltage signal LV, in operation S120. In operation S130, the latch circuit 35 may latch the second output signal according to the clock signal CK.

Figure 5:
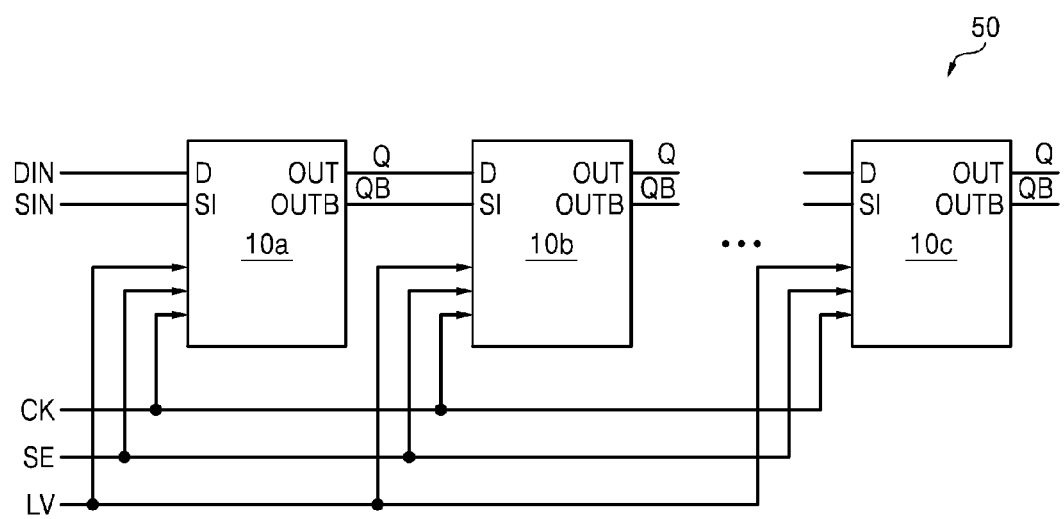
FIG. 5 is a block diagram of a data processing device including the scan flip-flop illustrated in FIG. 1 or 3, according to an exemplary embodiment in accordance with principles of inventive concepts.

FIG. 5 is a block diagram of an exemplary embodiment of a data processing device 50 in accordance with principles of inventive concepts, including a scan flip-flop 10 or 10,' such as that, respectively, of FIG. 1 or FIG. 3, according to an exemplary embodiment in accordance with principles of inventive concepts. Referring to FIG. 5, the data processing device 50 may include a plurality of scan flip-flops 10a, 10b, through to 10c. A structure and an operation of each of the scan flip-flops 10a, 10b, through to 10c are substantially the same as those of the scan flip-flop 10 of FIG. 1 and, therefore, their detailed description will not be repeated here. Alternatively, each of the scan flip-flops 10a, 10b, through to 10c may be implemented by using the scan flip-flop 10' of FIG. 3. The scan flip-flop 10a may include a first port D, which receives the data signal DIN, and a second port SI, which receives the scan input signal SIN. Each of the scan flip-flops 10b through 10c may include a port D, which receives output data Q, and a port SI, which receives inverted output data QB.

Although it is illustrated in FIG. 5 for convenience of explanation that the output signal Q is input to the port D and the inverted output signal QB is directly input to the port SI, the output signal Q may be input to the port SI and the inverted output signal QB may be directly input to the port D, for example.

According to exemplary embodiments in accordance with principles of inventive concepts, the output signal Q may be input to one of the ports D and SI after being processed by a first logic network (not shown), and the inverted output signal QB may be input to the other after being processed by a second logic network (not shown), for example. The first logic network and the second logic network may be identical logic networks or different logic networks and may be combinational logic circuits, for example.

Although it is illustrated in FIG. 5 that each of the scan flip-flops 10a, 10b, through to 10c includes an output port OUT that outputs the output signal Q and an inverted output port OUTB that outputs the inverted output signal QB, each of the scan flip-flops 10a, 10b, through to 10c may include only an output port OUT that outputs the output signal Q or the inverted output port OUTB, for example. Accordingly, the output signal Q or the inverted output signal QB output by the output port OUT of each of the scan flip-flops 10a, 10b, through to 10c may be directly input to the port D or SI. Additionally, data processing device 50 may be implemented using an integrated circuit (IC), a system on chip (SoC), a central processing unit (CPU), or a processor.

Figure 6:
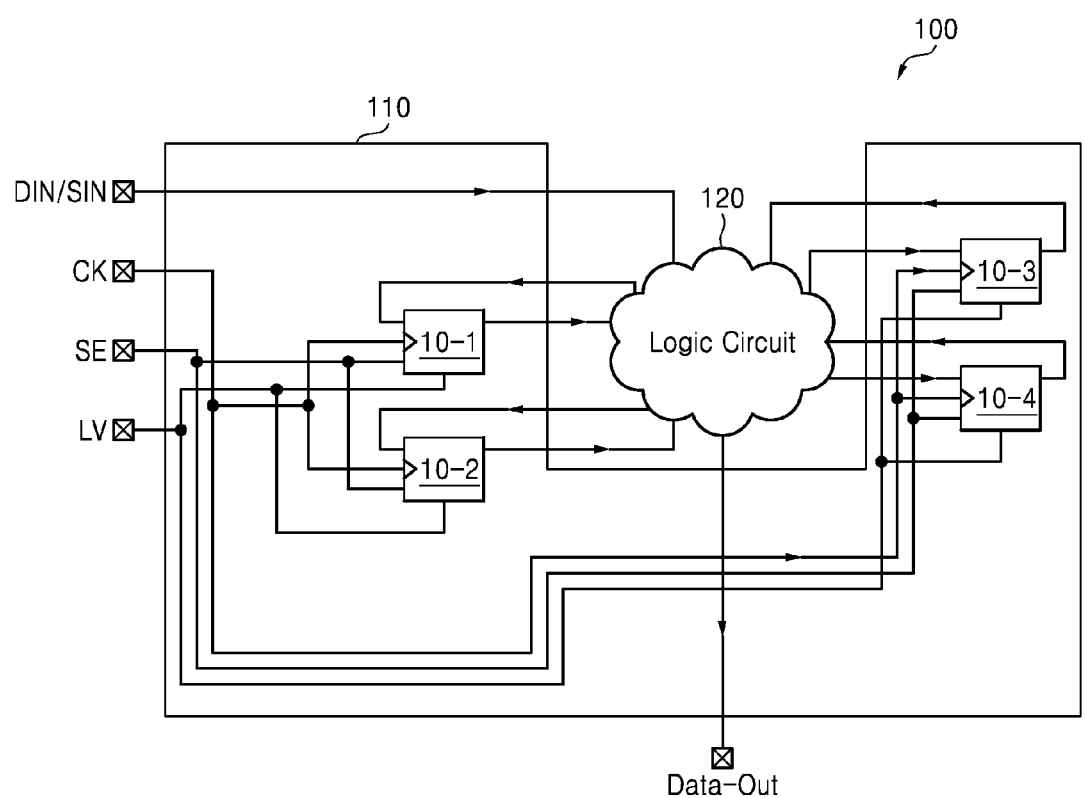
FIG. 6 is a block diagram of a data processing device including the scan flip-flop illustrated in FIG. 1 or 3, according to an exemplary embodiment in accordance with principles of inventive concepts.

FIG. 6 is a block diagram of an exemplary embodiment of a data processing device 100 in accordance with principles of inventive concepts that includes a scan flip-flop in accordance with principles of inventive concepts, such as scan flip-flop 10 or 10' illustrated in FIG. 1 or 3, for example. Data processing device 100 may be implemented as an integrated circuit (IC) or system on a chip (SOC), including a plurality of scan flip-flops 10-1, 10-2, 10-3, and 10-4, for example.

Each of the scan flip-flops 10-1, 10-2, 10-3, and 10-4 of FIG. 6 may be implemented by using the scan flip-flop 10 of FIG. 1 or the scan flip-flop 10' of FIG. 3 and may perform data communication with a logic circuit 120 according to the clock signal CK. In an exemplary embodiment in accordance with principles of inventive concepts, logic circuit 120 may be implemented using a synchronous circuit or an asynchronous circuit, for example, and may process the data signal DIN or the scan input signal SIN and output an output signal corresponding to a result of the processing, for example, output data Data-Out.

FIG. 7 is a block diagram of an exemplary embodiment of a data processing device 200, 300, or 400 in accordance with principles of inventive concepts that includes a scan flip-flop in accordance with principles of inventive concepts, such as the scan flip-flop 10 or 10' illustrated in FIG. 1 or 3, for example. Data processing device 200, 300, or 400 may be implemented using a personal computer (PC), a data server, or a portable electronic device, for example.

The portable electronic device 300 may be implemented by using a laptop computer, a mobile telephone, a smart phone, a tablet PC, a personal digital assistant (PDA), an enterprise digital assistant (EDA), a digital still camera, a digital video camera, a portable multimedia player (PMP), a personal (or portable) navigation device (PND), a handheld game console, mobile internet device (MID)), or an e-book, for example.

The data processing device 200, 300, or 400 may include a processor 100, a power source 210, a storage device 220, a memory 230, input/output (I/O) ports 240, an expansion card 250, a network device 260, and a display 270.

The data processing device 200, 300, or 400 may further include a camera module 280. The processor 100 may denote the data processing device 100 of FIG. 6 implemented by using an IC or an SoC. The processor 100 may be a multi-core processor. The processor 100 may control the operation of at least one of the elements 210-280. The power source 210 may supply an operational voltage to at least one of the elements 100 and 210-280.

The storage 220 may be implemented using a hard disk drive or a solid state drive (SSD), for example. The memory 230 may be implemented by using a non-volatile memory capable of storing a program code that can control an operation of the processor 100, or by using a volatile memory capable of storing data. For example, the non-volatile memory may be a flash memory, an embedded multimedia card (eMMC), or a universal flash storage (UFS). The volatile memory may be a dynamic random access memory (DRAM).

According to an exemplary embodiment, a memory controller capable of controlling a data access operation, for example, a read operation, a write operation (or a program operation), or an erase operation, with respect to the memory 230 may be integrated into or embedded in the processor 100.

According to another exemplary embodiment, the memory controller may be installed between the processor 100 and the memory 230.

The I/O ports 240 denote ports capable of transmitting data to the data processing device 200, 300, or 400 or data output from the data processing device 200, 300, or 400 to an external device. For example, the I/O ports 240 may be a port for connecting a pointing device, such as a computer mouse or a touch pad, to the data processing device 200, 300, or 400, a port for connecting an output device, such as the display 270 or a printer, to the data processing device 200, 300, or 400, a port for connecting an input device, such as a keypad or a keyboard, to the data processing device 200, 300, or 400, and a port for connecting a universal serial bus (USB) drive to the data processing device 200, 300, or 400.

The expansion card 250 may be implemented by using a secure digital (SD) card or a multimedia card (MMC). In some cases, the expansion card 250 may be a Subscriber Identification Module (SIM) card or a Universal Subscriber Identity Module (USIM) card.

The network device 260 denotes a device capable of connecting the data processing device 200, 300, or 400 to a wired or wireless network to achieve communication between an external device and the data processing device 200, 300, or 400.

The display 270 may display data output by the storage device 220, the memory 230, the I/O ports 240, the expansion card 250, or the network device 260. The camera module 280 denotes a module capable of converting an optical image into an electrical image. Accordingly, an electrical image output from the camera module 280 may be stored in the storage 220, the memory 230, or the expansion card 250. The electrical image output by the camera module 280 may be displayed on the display 270.

In exemplary embodiments of electronic devices a scan flip-flop in accordance with principles of inventive concepts may improve operation, and, in particular, improve stability of operation by reducing hold time, for example.

The foregoing is illustrative of exemplary embodiments and is not to be construed as limiting thereof. Although exemplary embodiments have been described, those skilled in the art will readily appreciate that many modifications are possible without materially departing from the novel teachings and advantages of inventive concepts.

What is claimed is:

1. A scan flip-flop comprising:
a selector to output a data signal or a scan input signal under control of a scan enable signal; and
a flip-flop including data, scan, scan enable, and clock inputs, wherein the scan input is connected to receive the output of the selector, the data input is connected to receive the data signal, the clock input is connected to receive a clock signal and the scan enable input is connected to receive a low voltage signal, wherein the low voltage signal is a control signal indicative of whether the scan flip-flop is operating with a low operating voltage.

2. The scan flip-flop of claim 1, wherein, when the low voltage signal is in a first level, the flip-flop latches the data signal according to the clock signal.

3. The scan flip-flop of claim 1, wherein, when the scan enable signal is in a first level and the low voltage signal is in a second level, the selector outputs the data signal, and the flip-flop latches the data signal output by the selector according to the clock signal.

4. The scan flip-flop of claim 1, wherein, when the scan enable signal is in a second level and the low voltage signal is in the second level, the selector outputs the scan input signal, and the flip-flop latches the scan input signal output by the selector according to the clock signal.

5. The scan flip-flop of claim 1, further comprising at least one delay circuit delaying at least one of the data signal input to the selector, the scan input signal input to the selector, or the output signal of the selector.

6. The scan flip-flop of claim 1, wherein the flip-flop comprises:
a multiplexer to output the output signal of the selector or the data signal in response to the low voltage signal; and
a latch circuit to latch an output signal of the multiplexer according to the clock signal.

7. The scan flip-flop of claim 1, wherein the flip-flop is implemented using an edge-triggered flip-flop, a master-slave flip-flop, a pulse-base flip-flop, a semi-dynamic flip-flop, a double edge trigger flip-flop, or a sense-amplifier flip-flop.

8. A data processing device comprising:
the scan flip-flop of claim 1; and
a logic circuit controlling the scan flip-flop.

9. The data processing device of claim 8, wherein the scan flip-flop further comprises at least one delay circuit to delay at least one of: the data signal input to the selector, the scan input signal input to the selector, or the output signal of the selector.

10. The data processing device of claim 8, wherein the flip-flop comprises:
a multiplexer to output the output signal of the selector or the data signal in response to the low voltage signal; and
a latch circuit to latch an output signal of the multiplexer according to the clock signal.

11. The data processing device of claim 8, wherein the data processing device is a system on chip (SoC), a processor, a central processing unit (CPU), a personal computer (PC), a data server, a smart phone, or a tablet PC.

12. A method of operating a scan flip-flop, the method comprising:
outputting from a selector a data signal or a scan input signal as a first output signal to a scan input of a flip flop under control of a scan enable signal; and
providing the data signal to a data input of the flip flop, and latching the first output signal or the data signal, under control of a clock signal and a low voltage signal, wherein the low voltage signal is a control signal indicative of whether the scan flip-flop is operating with a low operating voltage.

13. The method of claim 12, wherein the latching comprises:
outputting the first signal or the data signal as a second output signal in response to the low voltage signal; and
latching the second output signal according to the clock signal.

14. A scan flip-flop comprising:
a flip-flop including a data input port, a scan enable input, a clock input and a scan input port; and
a selector connected to the scan input port,
wherein a data signal or scan input signal is input to the scan input port via the selector according to a scan operating mode, the data signal is directly input to the data input port and, in a normal operating mode, data at the data input or, in a low voltage operating mode, the output of the selector at the scan input, is configured to be latched by the flip flop under control of a signal indicative of whether the flip flop is operating in a low voltage mode.

15. The scan flip-flop of claim 14,
further comprising at least one delay circuit delaying at least one of: the data signal input to the selector, the scan input signal input to the selector, or the output signal of the selector.

16. The scan flip-flop of claim 14, wherein the flip-flop is an edge-triggered flip-flop.

17. The scan flip-flop of claim 14, wherein the flip-flop is a master slave flip-flop.

18. The scan flip-flop of claim 14, wherein the flip-flop is semi-dynamic flip-flop.

19. A portable electronic device including the scan flip-flop of claim 14.

20. The portable electronic device of claim 19, wherein the device is a cellular telephone.

* * * * *